United States Patent [19]

Spence

[11] 4,004,163

[45] Jan. 18, 1977

[54] TIME DELAY, CHARGE, TRANSFER CIRCUIT

[75] Inventor: John R. Spence, Villa Park, Calif.

[73] Assignee: Rockwell International Corporation, El Segundo, Calif.

[22] Filed: Mar. 11, 1976

[21] Appl. No.: 666,116

[52] U.S. Cl. ............................ 307/293; 307/208; 307/246; 307/251; 307/304

[51] Int. Cl.[2] .................. H03K 5/13; H03K 17/56

[58] Field of Search .......... 307/208, 246, 251, 304, 307/293, 227

[56] References Cited

UNITED STATES PATENTS

| | | | |
|---|---|---|---|
| 3,443,190 | 5/1969 | Christiansen | 307/246 |
| 3,579,273 | 5/1971 | Cook | 307/246 |
| 3,654,487 | 4/1972 | Okamoto et al. | 307/227 |

Primary Examiner—Stanley D. Miller, Jr.
Attorney, Agent, or Firm—H. Fredrick Hamann; G. Donald Weber, Jr.; Morland Charles Fischer

[57] ABSTRACT

A time delay circuit comprising an improved charge transfer scheme for use in a microelectronic circuit, such as, but not limited to, a calculator, and the like. The circuit efficiently charges a capacitance means with a signal to subsequently energize a utilization means. Sufficient time delay is provided when charging the capacitance means, after power is applied to the microelectronic chip means and before the utilization means is suitably energized, to insure that associated logic is first initialized and sources of reference potential are at proper operating levels.

7 Claims, 3 Drawing Figures

TIME DELAY, CHARGE, TRANSFER CIRCUIT

BACKGROUND OF THE INVENTION

1. Field of the Invention

This invention relates to an improved time delay, charge transfer circuit to be utilized, in a preferred embodiment, in an electronic calculator, and the like, to provide suitable delay after power is applied to a semiconductive chip for the initialization of associated logic.

2. Prior Art

Conventional time delay circuits, such as that comprising a charge pump which includes a multi-terminal semiconductor device formed on a semiconductive substrate, are relatively unreliable circuits, because they are undesirably sensitive to the effects of substrate connections, the doping of the semiconductive substrate, temperature and neighboring multi-terminal devices.

SUMMARY OF THE INVENTION

The time delay circuit of the instant invention comprises an improved charge transfer scheme including first and second capacitors and a transmission gate means selectively connected therebetween. In a preferred embodiment, the transmission gate means is a field effect transistor. Suitable first and second clock signals are applied to the first capacitor and to the control electrode of the field effect transistor, respectively. The clock signals, each having on (i.e. active) and off (i.e. inactive) reference levels, are supplied relative to one another so that, during each clock cycle, the first clock signal is switched off at an interval of time before the second clock signal. That is, the second clock signal is on subsequent to the termination of the first clock signal.

Initially, each capacitor is discharged. The first capacitor is charged by the first clock signal. The charge of the first capacitor is transferred to the second capacitor via the conduction path of the transistor which is rendered conductive by the second clock signal. During each successive clock cycle, the charge of the first capacitor is repeatedly transferred to and accumulated by the second capacitor, when the transistor is rendered conductive. When both clock signals are switched off, the first capacitor is discharged to ground, and the transistor is otherwise rendered non-conductive.

DESCRIPTION OF THE PREFERRED EMBODIMENT

Figure 1:
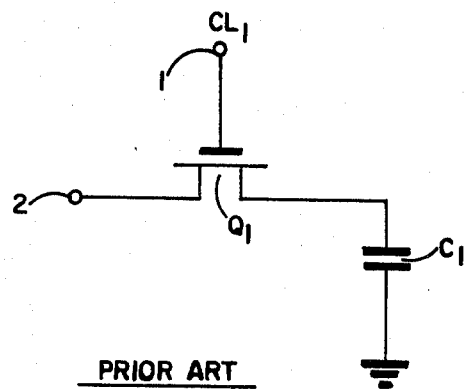
FIG. 1 shows a prior art time delay, charge pump circuit.

A prior art time delay circuit, commonly referred to as a charge pump, is shown in FIG. 1. Such a time delay circuit may be utilized in a microelectronic circuit, such as, but not limited to, a hand-held calculator, or the like, when sufficient time is needed after power is applied to the microelectronic chip means in order to first initialize (i.e. reset) associated logic. The prior art time delay circuit includes a multi-terminal semiconductor device (e.g. a field effect transistor $Q_1$) formed on a semiconductive substrate. The control or gate electrode of field effect transistor (FET) $Q_1$ is connected to a clock terminal means 1 to receive a suitable clock signal designated $CL_1$. One conduction path electrode of FET $Q_1$ is connected to a terminal means 2, which terminal electrically floats with respect to a source of reference potential, such as ground. A capacitor $C_1$ is connected between the second conduction path electrode of FET $Q_1$ and a source of reference potential, such as ground.

In operation, capacitor $C_1$ is charged by repeatedly enabling FET $Q_1$ by means of the clock signal $CL_1$ applied to the gate electrode thereof at clock terminal 1. As clock signal $CL_1$ is periodically turned off (i.e., switched to ground) and FET $Q_1$ is, thereby, rendered non-conductive, a small net current flows out of the space charge storage region of FET $Q_1$ so as to charge capacitor $C_1$.

However, several problems arise when utilizing the time delay, charge pump circuit of FIG. 1. One of the problems encountered by using the conventional charge pump is that very little charge is left on capacitor $C_2$ whenever the clock signal $CL_1$ periodically switches off. This can be explained by examining the circuit time constant, which is approximately $(C_{Q1}C_1/C_{Q1} + C_1).$(equivalent resistance of FET $Q_1$). Since the gate capacitance ($C_{Q1}$) of FET $Q_1$ is very small relative to the capacitance of capacitor $C_1$, the time constant is frequently less than the fall time of clock signal $CL_1$, which accounts for the little charge remaining on capacitor $C_1$. Moreover, the conventional charge pump is undesirably sensitive to the effects of substrate connections, temperature, neighboring transistors and the doping of the semiconductive substrate and is, therefore, a relatively unreliable circuit.

Figure 2:
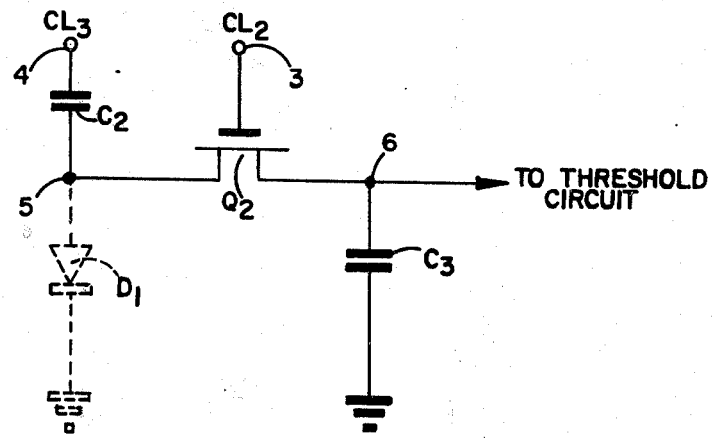
FIG. 2 is the improved time delay, charge transfer circuit of the instant invention.

The improved time delay, charge transfer circuit of the instant invention is shown in FIG. 2. The improved circuit, in a preferred embodiment, is formed on a suitable substrate by conventional (e.g. integrated circuit or the like) techniques. The gate or control electrode of a field effect transistor, FET $Q_2$, is connected to a clock terminal means 3. One conduction path electrode of FET $Q_2$ is connected to a common electrical junction 5 with one plate of a first capacitor $C_2$. The second plate of capacitor $C_2$ is connected to a clock terminal means 4. A unidirectional current conducting means (e.g. substrate diode $D_1$) is inherently formed at the intersection of a capacitor ($C_2$) and a conduction path electrode (the drain electrode) of a p-channel field effect transistor (FET $Q_2$). Diode $D_1$, shown dotted, is connected between common electrical junction 5 and a source of reference potential, such as ground. One plate of a second capacitor $C_3$ is connected at a common electrical junction 6 with the second conduction path electrode of FET $Q_2$. The second plate of capacitor $C_3$ is connected to a source of reference potential, such as ground. First and second capacitors $C_2$ and $C_3$ are interconnected to form a capacitive divider network. Second capacitor $C_3$ is selected to be many times greater (e.g. 150 times greater) than first capacitor $C_2$ in order that the voltage at common electrical junction 6 can be "pumped up" in relatively small steps to thereby insure a sufficient time delay for logic initialization before a final voltage is obtained. Common electrical junction 6 is connected to a suitable threshold circuit, such as, for example, a Schmitt Trigger.

Figure 3:
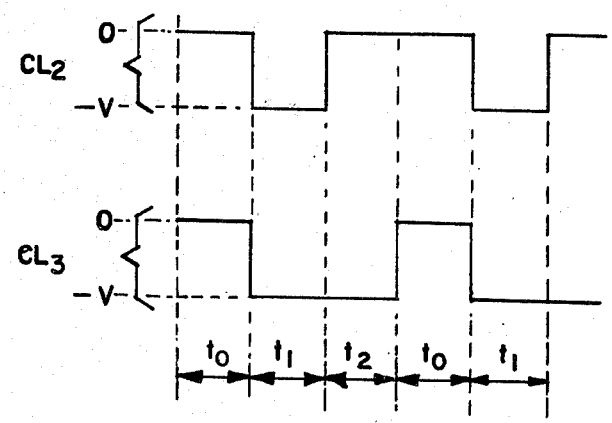
FIG. 3 is a representation of the waveforms of clock signals which control the improved time delay, charge transfer circuit of FIG. 2.

Clock terminal means 3 and 4, connected to the gate electrode of FET $Q_2$ and to the second plate of capacitor $C_2$, respectively, are connected to a suitable clock signal generator means (not shown). The signal generator is adapted to supply suitable clock signals, designated $CL_2$ and $CL_3$, to clock terminals 3 and 4. By way of example, clock signals $CL_2$ and $CL_3$ are multi-phase clock signals, the waveforms of which are represented in FIG. 3. Each of the clock signals, $CL_2$ and $CL_3$, have convenient off and on reference levels, designated O (ground) and −V (15 volts), respectively. Clock signal $CL_3$ is generated so as to return to ground from −V volts only after clock signal $CL_2$ is already returned to ground, as will be explained in greater detail hereinafter.

In accordance with the instant invention and referring concurrently to FIGS. 2 and 3, the operation of the improved time delay, charge transfer circuit is described as follows. Initially, during an interval of time designated $t_0$, each of the clock signals $CL_2$ and $CL_3$ is switched off by the generator thereof, and no charge is applied to electrical junction 6 or capacitors $C_2$ and $C_3$. During an interval of time designated $t_1$, clock signals $CL_2$ and $CL_3$ are each switched on and clock terminals 3 and 4 are energized (i.e. by clock signals, the voltage magnitude of which, $VCL_2$ and $VCL_3$, is each −V volts). As a result, capacitor $C_2$ is charged and FET $Q_2$ is rendered conductive during the $t_1$ clock interval. Common electrical junction 5 is maintained at a voltage close to ground, and diode $D_1$ is cutoff (i.e. back biased). Capacitor $C_2$ is connected to electrical junction 6 via the conduction path of FET $Q_2$ to precharge capacitor $C_3$. The change in voltage, $\Delta V_1$, of capacitor $C_3$ during the $t_1$ interval of the initial clock cycle is equivalent to the expression $(C_2/C_2 + C_3) \cdot (VCL_3)$. During an interval of time designated $t_2$, clock signal $CL_2$ is switched off (i.e. returns to ground), while clock signal $CL_3$ remains on (i.e. at a voltage, the magnitude of which is −V volts). Substrate diode $D_1$ continues to be cutoff during the $t_2$ interval. FET $Q_2$ is rendered non-conductive, and capacitor $C_3$ remains charged at its precharge voltage level.

During the $t_0$ time interval of the next clock cycle, clock signals $CL_2$ and $CL_3$ are again switched off by the clock signal generator and FET $Q_2$ remains non-conductive. The clock signal $CL_3$ applied to clock terminal 4 switches from −V volts to 0 volts during the $t_0$ interval. Therefore, the signal applied to electrical junction 5 also changes by a corresponding voltage from ground to a relatively positive voltage (+V volts), and diode $D_1$ is forward biased. Capacitor $C_2$ is, thereby, restored and the charge thereon is "dumped". That is, to return capacitor $C_2$ to its initial condition of having no charge, common electrical junction 5 is clamped to ground via substrate diode $D_1$. During the following $t_1$ time interval, when clock signals $CL_2$ and $CL_3$ are again each switched on (i.e. go negative a second time), first capacitor $C_2$ is charged and FET $Q_6$ is rendered conductive. Capacitor $C_2$ is again connected to capacitor $C_3$ via the conduction path of FET $Q_2$ to "pump up" the charge thereof. The change in voltage, $\Delta V_2$, of capacitor $C_3$ during the $t_1$ interval of the second clock cycle is equivalent to the expression $(C_2/C_2 + C_3) \cdot (VCL_3 - \Delta V_1)$.

During successive clock cycles, the voltage of capacitor $C_3$ will be progressively increased. However, as will be recognized by those skilled in the art, the maximum final voltage, $V_f$, that can be stored on capacitor $C_3$ to suitably energize the threshold circuit is equivalent to the voltage magnitude of clock signal $CL_3$ minus a threshold level drop in voltage of FET $Q_2$ (i.e. $V - V_t$). Should the final voltage exceed (i.e. become more negative than) $V - V_t$, FET $Q_2$ is cutoff for lack of sufficient threshold potential. It will also be recognized that the voltage of capacitor $C_3$ increases at a relatively decreasing rate with each successive clock cycle until a final suitable voltage is obtained, at which time the final voltage change ($\Delta V_n$) of capacitor $C_3$ is zero. The time to charge capacitor $C_3$ to a suitable final voltage, $V_f$, can be approximated by:

$$t = [V_f/(C_2/C_2 + C_3) \cdot (VCL_3 - V_f/2)] \cdot (\text{period of } CL_3).$$

By way of example, under operating conditions, where the period of clock signal $CL_3$ is 10μs, the voltage magnitude ($VCL_3$) of clock signal $CL_3$ is 10 volts, the final voltage ($V_f$) of electrical junction 6 and capacitor $C_3$ is 3 volts, $C_2$ is 0.025 pf, and $C_3$ is 15 pf; then the time ($t$) to charge capacitor $C_3$ is approximately 5.14 milliseconds.

By virtue of the instant invention, a reliable time delay, charge transfer circuit is disclosed, which circuit is dependent upon capacitance and the frequency and magnitude of a clock signal. The present time delay charge transfer circuit is not adversely susceptible to temperature, effects of neighboring transistors, etc., as is the relatively unpredictable charge pump circuit of the prior art. Moreover, the instant circuit efficiently charges a capacitor with sufficient time delay to insure that associated logic is reset to initial operating conditions and sources of reference potential are properly raised to full operating levels.

It will be apparent that while a preferred embodiment of the invention has been shown, and described, various modifications and changes may be made without departing from the true spirit and scope of the invention. For example, although, in a preferred embodiment, FET $Q_2$ is a p-channel semiconductive device, any other suitable multi-terminal semiconductive device may be employed. The waveforms of the clock signals and the source of reference potential correspond to the type of device selected.

Having thus set forth a preferred embodiment of the instant invention, what is claimed is:

1. A charge transfer circuit comprising,
first and second charge storage means,
transmission gate means selectively connected between said first and second charge storage means,
clock terminal means connected to the first charge storage means and to a control electrode of said transmission gate means,
a source of reference potential, and
unidirectional current conducting means,
said second charge storage means connected between said transmission gate means and said source of reference potential,
said unidirectional current conducting means connected between said first charge storage means and said source of reference potential,
said first charge storage means and said control electrode of said transmission gate means each receiving respective clock signals having an active level to charge said first charge storage means and enable said transmission gate means during a first interval of time, whereby the signal of said first charge storage means is transferred to said second charge storage means via a conduction path of said transmission gate means, the respective clock signal of said first charge storage means remaining at the active level and the respective clock signal at said transmission gate means control electrode having an inactive level to disable said transmission gate means and thereby isolate said second charge storage means from said first charge storage means during a succeeding second interval of time, and each of the respective clock signals at said first charge storage means and said transmission gate means control electrode having an inactive level during a succeeding third interval of time, whereby said first charge storage means is selectively discharged to said source of reference potential via the conduction path of said unidirectional current conducting means.

2. The charge transfer circuit recited in claim 1, wherein said unidirectional current conducting means is a diode.

3. The charge transfer circuit recited in claim 1, wherein said transmission gate means includes a multi-terminal semiconductor device having a conduction path thereof connected between said first and second charge storage means.

4. The charge transfer circuit recited in claim 3, wherein said multi-terminal semiconductor device is a field effect transistor.

5. The charge transfer circuit recited in claim 1, wherein said first and second charge storage means include a capacitor.

6. The charge transfer circuit recited in claim 5, wherein the capacitor comprising said second charge storage means is substantially larger than the capacitor comprising said first charge storage means.

7. A time delay circuit for energizing a utilization means, said circuit comprising, a source of reference potential, first and second capacitance means, diode means connected to said source of reference potential, a multi-terminal semiconductor device, one conduction path terminal of said semiconductor device connected to said diode means and said first capacitance means, a second conduction path terminal of said semiconductor device connected to said second capacitance means and said utilization means, and a control terminal of said semiconductor device and said first capacitance means connected to clock terminal means to receive respective clock signals including active and inactive reference levels, each of said clock signals having coinciding active reference levels during a first clock interval to periodically charge said first capacitance means and enable said semiconductor device to thereby connect said first capacitance means to said second capacitance means via the first and second conduction path terminals of said semiconductor device to successively charge said second capacitance means to a cumulative signal sufficient to energize said utilization means, said first capacitance means receiving a respective clock signal having an active reference level and said control terminal receiving a respective clock signal having an inactive reference level during a second succeeding clock interval to isolate said second charge storage means from said first charge storage means, and each of said clock signals having coinciding inactive reference levels during a third successive clock interval to cause said first capacitance means to be connected to said source means via the conduction path of said unidirectional current conducting means and thereby selectively discharge said first capacitance means.

* * * * *